United States Patent
Byagowi et al.

(10) Patent No.: US 11,523,546 B1
(45) Date of Patent: Dec. 6, 2022

(54) RACK-LEVEL AISLE EMULATOR

(71) Applicant: Meta Platforms, Inc., Menlo Park, CA (US)

(72) Inventors: Ahmad Byagowi, Fremont, CA (US); Cheng Chen, Fremont, CA (US); Vijay Mohan, San Jose, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 556 days.

(21) Appl. No.: 16/600,319

(22) Filed: Oct. 11, 2019

(51) Int. Cl.
*H05K 7/14* (2006.01)
*H05K 7/20* (2006.01)

(52) U.S. Cl.
CPC ....... *H05K 7/20836* (2013.01); *H05K 7/1488* (2013.01); *H05K 7/20754* (2013.01)

(58) Field of Classification Search
CPC ............. H05K 7/20836; H05K 7/1488; H05K 7/20754; H05K 7/20745; H05K 7/2079; H05K 7/20736; H05K 7/20; H05K 7/20145; H05K 7/20781; H05K 7/20718; H05K 7/20818; H05K 7/20136; H05K 7/207; G06F 1/20; G06F 1/206; G06F 11/2289; G06F 11/3051; G06F 2200/201
USPC .. 361/690, 679.46, 679.49, 691, 688, 679.5, 361/692, 724; 165/104.33, 287, 80.2; 312/236
See application file for complete search history.

(56) References Cited

U.S. PATENT DOCUMENTS

| | | | |
|---|---|---|---|
| 10,264,715 B1* | 4/2019 | Ortega Gutierrez | H05K 7/20745 |
| 10,667,435 B1* | 5/2020 | Alissa | H05K 7/20836 |
| 2009/0168345 A1* | 7/2009 | Martini | H05K 7/20745 361/691 |
| 2009/0210096 A1* | 8/2009 | Stack | H05K 7/20745 700/278 |
| 2012/0087087 A1* | 4/2012 | Nicolai | H05K 7/20836 361/679.48 |
| 2014/0268547 A1* | 9/2014 | Kondo | H05K 7/20836 165/47 |
| 2020/0084912 A1* | 3/2020 | Slessman | H05K 7/2059 |
| 2020/0100394 A1* | 3/2020 | Albinger | H05K 7/20718 |

\* cited by examiner

*Primary Examiner* — Mandeep S Buttar
(74) *Attorney, Agent, or Firm* — Van Pelt, Yi & James LLP

(57) ABSTRACT

A system including a data center rack enclosure, a first aisle emulator, and a second aisle emulator. The data center rack enclosure is configured to retain a data center rack, which has a first side and a second side. The first aisle emulator is coupled with the data center rack enclosure and provides a first controlled test environment with first temperature and a first gas flow to the first side of the data center rack. The second aisle emulator is coupled with the data center rack enclosure and provides a second controlled test environment for the second side of the data center rack.

16 Claims, 4 Drawing Sheets

RACK-LEVEL AISLE EMULATOR

BACKGROUND OF THE INVENTION

Large networks, such as those that support social media and other applications having large numbers of users, employ data centers to house network components. Typically, multiple network components, such as servers and battery backup units, are housed in a data center rack. Multiple data center racks are located in a data center. Prior to deploying new configurations of network components in data center racks, it is desirable to determine how individual components will perform. Accordingly, a mechanism that tests the performance of network components is desired.

BRIEF DESCRIPTION OF THE DRAWINGS

Various embodiments of the invention are disclosed in the following detailed description and the accompanying drawings.

DETAILED DESCRIPTION

Figure 1A:
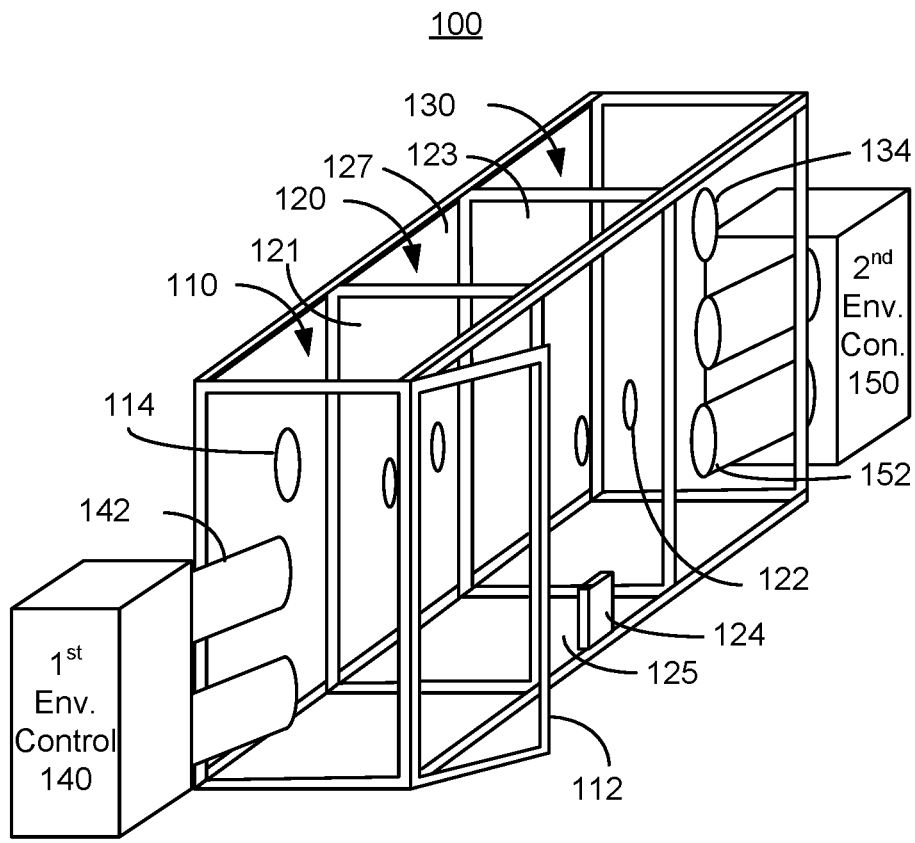
FIGS. 1A-1C are diagrams depicting an embodiment of a system for testing computing equipment in a data center rack.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Data centers typically house a very large number of network components, or computing equipment, in racks. Such network components may include computing device such as servers and battery backup units (BBUs). Each data center rack includes multiple network components and a single data center holds a large number of data center racks. Data center racks are frequently arranged in rows with an aisle on each side of the row. For example, some data centers may include fifteen to twenty racks in a row. One aisle, the cold aisle, is the source of cooler gas flow for the rack. The gas exits the data center racks at the other, hot aisle. In determining whether to change the configuration of network components, which network components to deploy or the source of performance issues, it is desirable to understand how individual networks components perform in a data center.

Network components used in data centers can be separately tested. For example, an individual BBU might be tested in a wind tunnel and/or have its performance modeled to infer how the BBU will function in the data center. However, it has been determined that the behavior of computing devices may be affected by local variations in their environment. For example, a BBU's performance might be influenced by the surrounding temperature and/or the flow of gas (e.g. air) past the BBU. It has been also determined that conditions such as the local temperature and airflow near the BBU may be affected not only by the ambient temperature of the data center and flow of gas through the data center, but also by factors such as the heat generated by and gas flow to other components in the rack, the heat generated by gas flow to components in nearby racks and other characteristics of the data center. In addition, the conditions may vary not only within a data center, but also between data centers. Thus, testing and modeling of individual components may not sufficiently describe operation of network components in a specific location of a particular data center. Accordingly, a mechanism that tests the performance of network components for use in a data center is desired.

Figure 1B:
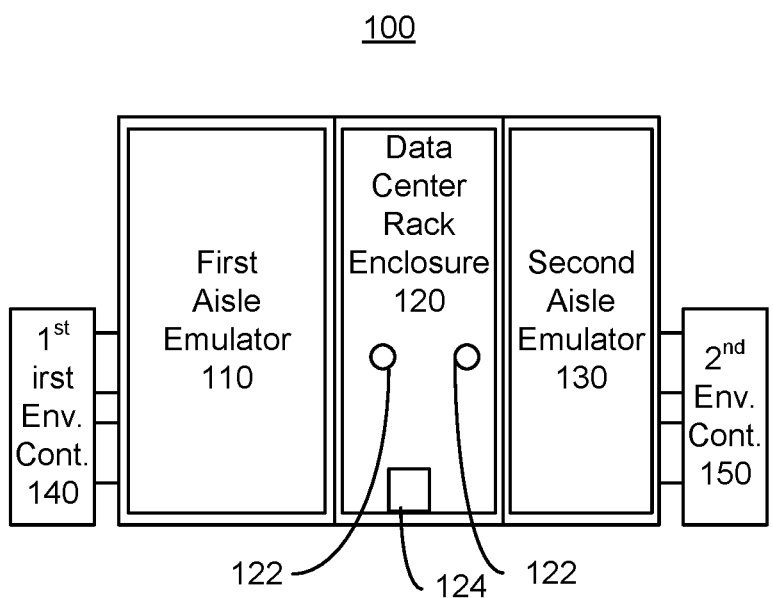
Figure 1C:
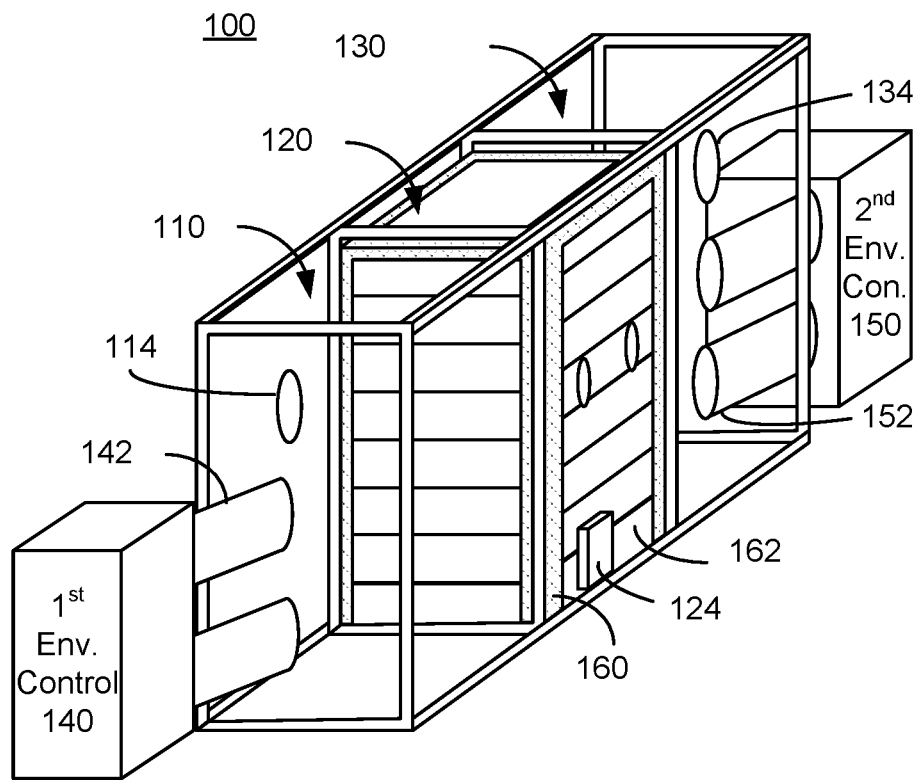

FIGS. 1A-1C are diagrams depicting an embodiment of system 100 for testing computing equipment in a data center rack. FIG. 1A depict perspective and side views of system 100. FIG. 1C depicts a perspective view of system 100 in conjunction with a data center rack 160 housing network components 162 that may be undergoing testing. FIGS. 1A-1C are not to scale and may include other components that are not shown for simplicity. Although described in the context of a data center rack, in other embodiments, system 100 may be used to test other racks housing computing equipment used for other purposes.

System 100 includes first aisle emulator 110, data center rack enclosure 120 and second aisle emulator 130. Also shown are first environmental control unit 140 coupled with first aisle emulator 110 and second environmental control unit 150 coupled with second aisle emulator 130. In some embodiments, environmental control unit 150 might be omitted. For example, if gas flow and temperature are desired to be controlled only by first environmental control unit 140 and first aisle emulator 110, second environmental control unit 150 might be omitted. Instead, sensors, a one-way valve (to allow for gas flowing from first aisle emulator 110 to exit system 100) and/or other passive controls may be utilized.

Data center rack enclosure 120 is configured to fit at least one data center rack. In the embodiment shown, data center rack enclosure 120 can retain one data center rack 160. Data center rack enclosure 120 has first side 121 connected to first aisle emulator 110 and second 123 side connected to second aisle emulator 130. Data center rack 120 also includes two lateral sides 125 and 127 opposing each other and between first side 121 and second side 123. Lateral sides 125 and 127 of data center rack 120 may be formed of polycarbonate or other material capable of substantially maintaining a desired pressure. Lateral sides 125 and 127 may be desired to be transparent or translucent in order to allow viewing of data center rack 160 during testing. In some embodiments, data center rack enclosure 120 may have door(s) (not shown) on first side 121 and/or second side 123 to seal data center rack enclosure 120 from first aisle emulator 110 and/or second aisle emulator 130. In other embodiments, another mechanism may be used to seal or otherwise divide data center rack enclosure 120 from first aisle emulator 110 and/or second aisle emulator 130. In some embodiments, first side 121 and second side 123 are open.

Data center rack 120 enclosure also includes ports 122 and sensors 124. In some embodiments, ports 122 and/or sensors 124 may be omitted. For example, at least some sensors may be located on data center rack 160 (and/or components therein) instead of on data center rack enclosure 120. Sensors 124 are depicted as being in a single location on one lateral side 125. However, sensors 124 need not be located together and need not be on a single side. For example, sensors 124 may be located on one or both lateral sides 125 and 127, the ceiling and/or floor of data center rack enclosure 120. At least some sensors 124 might be suspended from the ceiling, forming a mesh on the first side 121 and/or second side 123 of data center rack enclosure 120. Sensors 124 may be configured to be connected to or positioned in proximity to one or more network components 162 in data center rack 160. At least some sensors 124 may be located at or in proximity to first side 121 of data center rack enclosure 120. Such sensors 124 may be used to sense gas flow, temperature, pressures, humidity and/or other environmental conditions produced at or by first aisle emulator 110. Similarly, at least some sensors 124 may be located at or in proximity to second side 123 of data center rack enclosure 120. Such sensors 124 may be used to sense gas flow, temperature, pressures, humidity and/or other environmental conditions produced at or by second aisle emulator 130. Some sensors 124 may be used to monitor the behavior of network components 162, such as BBUs or servers, housed in data center rack 160 and undergoing testing in data center rack enclosure 120.

Ports 122 are depicted as located on lateral sides 125 and 127. For clarity, only one port 122 is labeled. Although two ports 122 are shown on each side, in some embodiments, another number of ports might be used. Ports 122 may be used for environmental control, electrical connection and/or other purposes. In some embodiments, ports 122 may be connected to a source of gas, vacuum, heat and/or cooling. For example, if additional gas flow is desired to be provided from or redirected to lateral side(s) 125 and/or 127, multiple ports may be distributed across the sides 125 and/or 127. In such embodiments, gas flow generation system(s) (not shown) and/or pumps may be coupled with ports 122 in lateral side(s) 125 and/or 127. For example, a system analogous to first or second environmental control units 140 or 150 might be used. In some embodiments, additional sensors, power, and or other electrical connections may be made through ports 122. In some embodiments, data center rack enclosure 120 includes a power source or power connection for data center rack 160 and/or for portions of system 100.

System 100 also includes first aisle emulator 110 and second aisle emulator 130. Aisle emulators 110 and 130 are so named because aisle emulators 110 and 130 may provide environment(s) for data center rack 160 that mimic the conditions in aisles of data centers. First aisle emulator 110 includes door 112 or other entry mechanism and ports 114. Second aisle emulator 130 includes ports 134 and may include a door (not shown) or other entry mechanism. In some embodiments, sides, tops, bottoms and door(s) may be formed of polycarbonate. Aisle emulators 110 and 130 are shown as integrated together with data center rack enclosure 120. In some embodiments, aisle emulators 110 and/or 130 are sealably connected to data center rack enclosure 120. Stated differently, any connections between aisle emulators 110 and/or 130 and data center rack enclosure 120 may be airtight. Aisle emulators 110 and 130 may also be sealed from the environment external to system 100. Thus, system 100 may be sealed (e.g. airtight) so that its interior environment may be controlled. The environment in first aisle emulator 110 and, in some embodiments, second aisle emulator 130 may be controlled. First aisle emulator 110 can provide a first controlled test environment to first side 121 of data center rack enclosure 120. Similarly, second aisle emulator 130 can provide a second controlled test environment at second side 123 of data center rack enclosure.

In the embodiment shown, first environmental control unit 140 is coupled with some of ports 114 via connectors 142. In some embodiments, second environmental control unit 150 is coupled with some of ports 134 via connectors 152. Although two ports are shown as being used by each of the units 140 and 150, another number of ports may be employed. First environmental control unit 140 can provide the first controlled test environment in first aisle emulator 110. For example, first environmental control unit 140 provides the desired gas flow(s) and temperature(s) at first side 121 of data center rack enclosure 120 and, therefore, the first side of data center rack 160. In some embodiments, environmental control unit 140 in combination with sealable first aisle emulator 110 provides the desired pressure, humidity and/or other conditions to first side 121 of data center rack enclosure 120. For example, the volume of gas per unit time, temperature of the gas and/or chamber formed by the walls and door 112 of first aisle emulator 110, humidity and other features of the chamber may be controlled by first environmental control unit 110. In some embodiments, first environmental control unit 140 may be a heating ventilation and cooling (HVAC) unit. In some embodiments, the pressure maintained within first aisle emulator 110 may be less than atmospheric pressure surrounding system 100. Thus, first environmental control unit may include a vacuum pump. To streamline flow, first aisle emulator 110 and/or first environmental control unit 140 may have a honeycomb structure attached to ports 114. In some embodiments, multiple ports may be distributed across the side(s), top and/or bottom of first aisle emulator 110, at least some of which may have independently controlled flow and/or gas temperature. Thus, a desired pattern of airflow may be provided to first side 121 of data center rack enclosure 120. In order to maintain the desired environmental conditions within first aisle emulator, environmental control unit 140 and/or first aisle emulator 110 may include sensors such as temperature, gas flow, humidity and/or pressure sensors. In such embodiments, first environmental control unit 140 may utilize the output of these sensors to automatically control pumps, heaters, cooling units and/or components within first environmental control unit 140. In some embodiments, feedback from sensors 124 relating to the environmental conditions at first side 121 and/or within data center rack enclosure 120 may be used in addition to or in lieu of information from sensors in first aisle emulator 110 to control the output of first environmental control unit 140. Thus, the desired environment may be maintained within system 100. Although shown as a single unit, the functions of first environmental control unit 140 may be broken into multiple separate units.

Second aisle emulator 150 provides a controlled environment to second side 123 of data center rack enclosure 120. In some embodiments, environmental control unit 150 might be omitted. For example, if gas flow and temperature are desired to be controlled only by first environmental control unit 140 and first aisle emulator 110, second environmental control unit 150 might be omitted. In such embodiments, passive controls such as one way valves or vents may be coupled with ports 134. In some embodiments, second environmental control unit 150 can provide the second controlled test environment in second aisle emulator 130. For example, second environmental control unit 150 may provide the desired gas flow(s) and/or temperature(s) at second side 123 of data center rack enclosure 120 and, therefore, the second side of data center rack 160. In some embodiments, environmental control unit 150 in combination with sealable second aisle emulator 130 provides the desired pressure, humidity and/or other conditions to second side 123 of data center rack enclosure 120. In some embodiments, second aisle emulator 130 and/or second environmental control unit 150 may have a honeycomb structure attached to ports 134. In some embodiments, multiple ports may be distributed across the side(s), top and/or bottom of second aisle emulator 130, at least some of which may have independently controlled flow and/or gas temperature. Like first environmental control unit 110, second environmental control unit 150 may provide in second aisle emulator 130 a pressure that is greater than, equal to, or less than atmospheric pressure at the testing site; a desired gas flow; a desired temperature; a desired humidity and/or other environmental conditions. In some embodiments, feedback from sensors (not shown) in second aisle emulator 130 and/or sensors 124 may be used to control the output of second environmental control unit 150. Thus, the desired environment may be maintained within system 100. In some embodiments, second environmental control unit 150 may be an HVAC unit, may include a vacuum pump, heater, cooler and/or may have its functions split into multiple separate unit.

FIG. 1C depicts system 100 with data center rack 160 in place. Network components 162 (of which only one is labeled for clarity) are also shown. Although not specifically indicated in FIG. 1C, network components 162 held in data center rack may be all the same or may differ. In some embodiments, the configuration of network components 162 mimics that found in a data center rack in a data center of interest. First aisle emulator 110 may provide the desired test environment to first side 121 of data center rack enclosure 120 and thus to a first side of data center rack 160. Thus, first aisle emulator 110 in conjunction with first environmental control unit 140 may mimic the gas flow, temperature and/or other aspects of an environment in a particular data center. This gas may flow through rack 160 around components 162 to the second side of data center rack 160 and thus to second side 123 of data center rack enclosure 120. Second aisle emulator 130 may simply provide a controlled (e.g. sealed) environment at second side 123 of data center rack enclosure 120 to allow gas to flow through system 100. In some embodiments, second aisle emulator 130 in connection with second environmental control unit 150 may control the test environment at second side 123 of data center rack enclosure 120 (and thus at the second side of data center rack 160). For example, second aisle emulator may control pressure, temperature, humidity, gas flow and/or other aspects of the environment in second aisle emulator 130. In some embodiments, first aisle emulator 110 may thus mimic the cold aisle of a data center while second aisle emulator may mimic the hot aisle of a data center.

System 100 allows network components 162 housed in data center rack 160 to be tested together under a variety of conditions. System 100 may simulate the environments in individual data centers. For example, the local conditions that individual racks are exposed to in data centers may be sensed. Thus, variations between different locations in a single data center and between different data centers may be determined. System 100 may mimic these conditions to allow network components 162 in data center rack 160 to be operated and tested under the actual conditions in which the network components 162 may function. For example, pressure may be reduced to mimic higher altitude data centers, cold gas of the appropriate temperature and flow may be provided from first aisle emulator 110 to simulate flow from the cold aisle at a particular location in the data center and second aisle emulator 130 may be heated to simulate the hot aisle in the particular location in the data center. In some embodiments, conditions such as flow across first side 121 may be varied to account for local variations across an individual data center rack. At least some of sensors 122 and/or other sensors are also used to monitor performance of network components 162. Thus, performance, reliability and other characteristics of network components 162 as deployed in a data center rack 160 may be investigated. For example, timings of failures, whether adequate gas flow can be provided and whether a sufficiently low temperature may be maintained for particular network components 162 can be examined. Whether changes in the locations of network components 162 within data center rack 160 may improve performance or reliability and/or how network components 162 affect each other may also be investigated. System 100 may also subject network components 162 to harsher environments than are generally present in data centers. For example, extremely high or low temperatures, low or high gas flows, wider ranges in humidity and/or larger variations pressure may be provided at the sides of data center rack 160 during operation of some or all of network components 162. Thus, failure conditions for various network components 162 within data center rack 160 may be discovered. Best case and worst case operating conditions may be simulated in some embodiments. Thus, performance of network components 162 under such conditions may be determined. Similarly, a failure of facilities such as temperature control at a data center may be investigated. For example, conditions at a data center may be mimicked, and then environmental control units 140 and 150 turned off while system 100 is sealed. Network components 162 are continued to allow to operate in the sealed environment. Thus, it can be determined how long various network components 162 can function under such conditions. As a result, performance and reliability of network components 162 in a data center rack may be determined. Further, the effect of changing data center operating conditions on network components 162 in a data center rack 160 may also be determined. For example, the temperature and gas flow through system 100 may be reduced or increased from that of a data center of interest to investigate whether performance of network components 162 is affected. This may allow more optimal conditions in a data center to be discovered. Thus, in addition to facilitating decisions relating to network components 162 in a data center, management of data centers facilities may also be improved.

Figure 2:
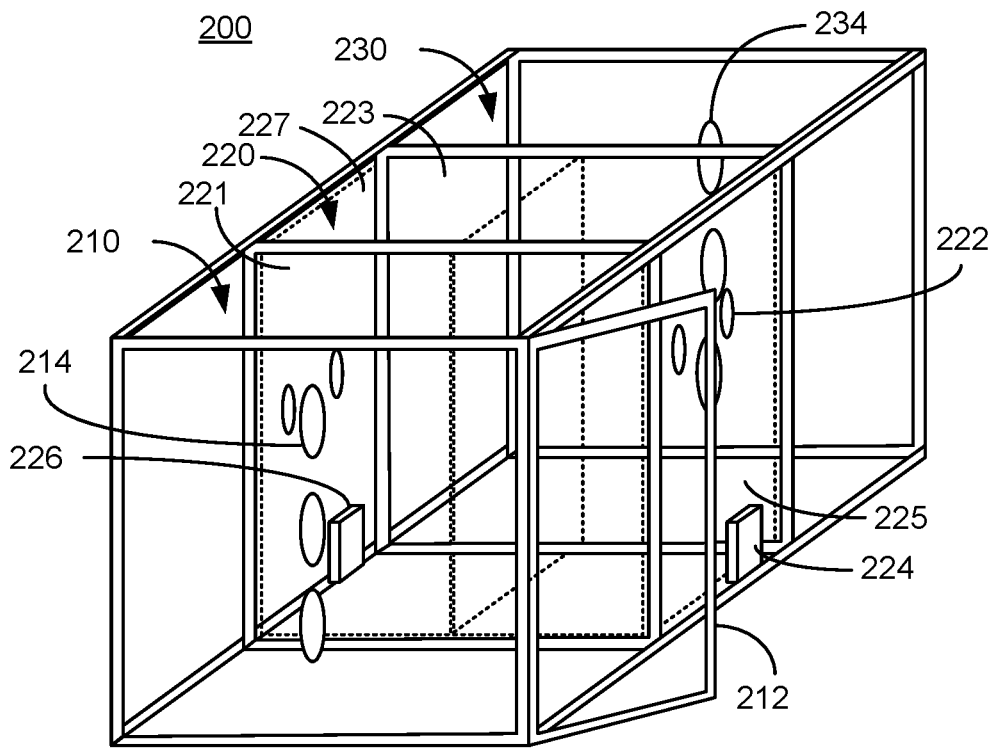
FIG. 2 depicts another embodiment of a system for testing computing equipment in a data center rack.

FIG. 2 depicts a perspective view of another embodiment of system 200 for testing computing equipment in a data center rack. FIG. 2 is not to scale and may include other components that are not shown for simplicity. Although described in the context of a data center rack, in other embodiments, system 200 may be used to test other racks housing computing equipment used for other purposes. System 200 includes first aisle emulator 210, data center rack enclosure 220 and second aisle emulator 230. Although not shown, system 200 generally includes a first environmental control unit coupled to first aisle emulator 210 and a second environmental control unit coupled to second aisle emulator 230. Such environmental control units are analogous to first environmental control unit 140 and second environmental control unit 150.

First aisle emulator 210 is analogous to first aisle emulator 110. Thus, first aisle emulator 210 is shown as including door 212 and ports 214 that are analogous to door 112 and ports 114. Data center rack enclosure 220 is analogous to data center rack 120. Thus, data center rack 220 includes first side 221, second side 223 and lateral sides 225 and 227 that are analogous to first side 121, second side 123 and lateral sides 125 and 127 of data center rack enclosure 120. Data center rack enclosure 220 also includes ports 222 and sensors 224. Additional sensors 226 are also explicitly shown. In some embodiments, additional sensors 226 may be omitted. Ports 222 and sensors 224 and 226 are analogous to ports 122 and sensors 124. Second aisle emulator 230 is analogous to second aisle emulator 130. Thus, second aisle emulator 230 includes ports 234 that are analogous to ports 134.

System 200 is configured to hold and test multiple racks. In the embodiment shown in FIG. 2, data center rack enclosure may retain two racks (positions shown by dotted lines in FIG. 2). Thus, network components in multiple racks may be tested together.

System 200 may share the benefits of system 100. For example, network components within data center racks may be tested together under conditions better approximating those found in data centers. Performance and reliability may thus be determined. Network components within data center racks may also be tested under more extreme conditions than generally found in data centers, for example to determine failure modes. In some embodiments, improvements in data center operations may also be determined.

Figure 3:
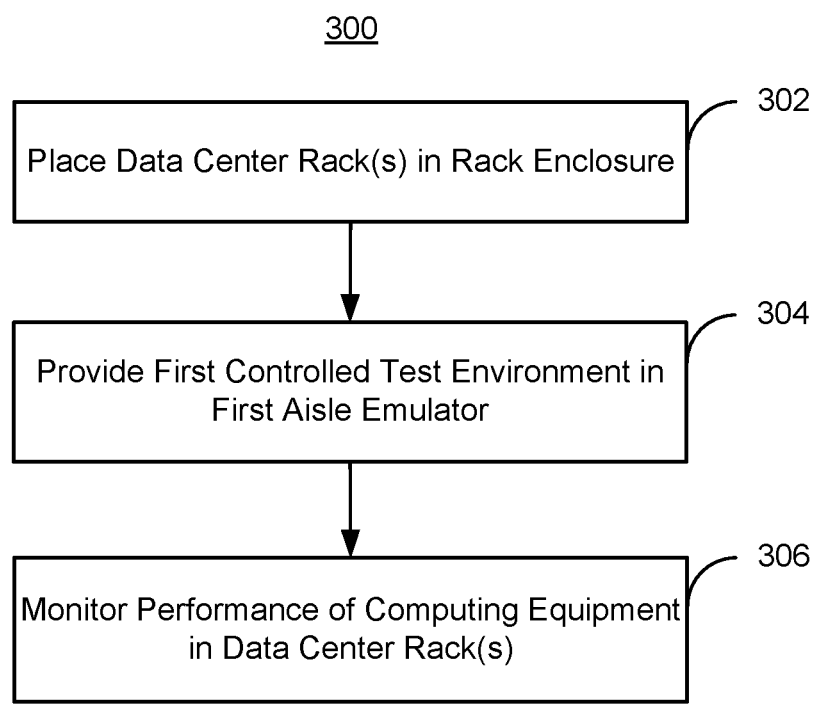
FIG. 3 is a flow chart depicting an embodiment of a method for testing computing equipment in a data center rack.

FIG. 3 is a flow chart depicting an embodiment of method 300 for testing computing equipment in a data center rack. Method 300 is described in the context of system 100. However, method 300 may be utilized with other systems, including but not limited to system 200. Although shown in a particular order, at least some of the processes may be performed in another order including but not limited to in parallel. For simplicity, only some of the processes may be shown.

One or more data center racks are placed in a data center rack enclosure of a system, at 302. The data center rack(s) hold network components. In some embodiments, sensors are provided on or coupled to network components that are desired to be tested as part of 302. Thus, some or all of the network components carried by the data center rack may be monitored. In some embodiments, network components to be tested may be provided with connectors to which sensors and/or other monitoring equipment may be coupled. The system in which the data center rack is placed at 302 is configured to provide a first controlled test environment at a first side of the data center rack (e.g. the side corresponding to the cold aisle of a data center) and a second controlled test environment at a second side of the data center rack (e.g. the side corresponding to the hot aisle of the data center). Also as part of 302, network components may be connected to power and turned on. In some embodiments, the network components are subjected to loads analogous to those that would be experienced during operation in a data center.

A first controlled test environment is provided at the first side of the data center rack, at 304. For example, temperature and or gas (e.g. air) flow is controlled. In some embodiments, other parameters may also be controlled at the first side of the data center rack. For example, humidity and pressure may be regulated. In some embodiments a second controlled test environment is also provided at the second side of the data center rack. The second test environment may be provided by sealing the region near the second side of the data center rack and providing a controlled outlet for gas. In some embodiments, factors such as temperature, pressure, gas flow and humidity may be controlled in the second test environment. In some embodiments, such environmental conditions may also be controlled on the lateral sides of the data center rack. For example, the temperature, humidity, pressure and/or gas flow may be controlled on one or both sides of the data center rack to mimic the presence of other data center racks carrying network components. Thus, at 304 the data center rack and components therein are subjected to the desired environmental conditions.

Performance of one or more of the network components in the data center rack is monitored, at 306. In some embodiments, 306 is performed at least while the environment is provided at 304. In addition, operation of network components may be observed before and/or after 304. Thus, changes in performance, including the occurrence of failures, can be investigated as the network components are in a data center rack and within a controlled environment.

For example, data center rack 160 including network components 162 may be placed in data center rack enclosure 120, at 302. FIG. 1C depicts data center rack 160 after being placed in system 100. Because of its configuration, system 100 may also be used to provide the controlled environment(s) to data center rack 160, at 304. More specifically, first aisle emulator 110 and first environmental control unit 140 may be used to provide the first controlled test environment at first side 121 of data center rack enclosure 120 and, therefore, at the first side of data center rack 160. Also as part of 304, second aisle emulator 130 provides a controlled test environment at second side 123 of data center rack enclosure 120 and, therefore, at the second side of data center rack 160. In some embodiments, ports 122 may be used to provide a desired environment at the lateral sides 125 and 127 of data center rack enclosure 120. For example, environmental control unit(s) (not shown) may be coupled with ports 122 and provide the desired temperature(s), pressure(s), humidity/humidities, gas flow(s) and/or other condition(s) at one or both lateral side(s) 125 and/or 127 of data center rack enclosure 120. Thus, the local environment near sides of the data center rack 160 and data center rack enclosure 120 may be controlled at 304. One or more network components 162 in data center rack 160 are powered on during at least part of 304. In some embodiments, load(s) are also provided to some or all network component(s) 162. Thus, network components 162 within data center rack 160 operate in a controlled environment and their performance monitored, at 306.

Method 300 allows network components in one or more data center racks, such as network components 162 housed in data center rack 160, to be monitored together under controlled conditions. For example, at 304, conditions analogous to the environment(s) in individual data center(s) may be provided at the data center rack(s). In some embodiments, at 304 other conditions including but not limited to a reduced or nonexistent flow, extreme pressures and/or other environments may be provided for testing the network components in the data center rack. The network components in a rack may be operated and tested under the actual conditions in which the network components may function and/or under other selected environments. Thus, performance, reliability and other characteristics of network components as deployed in a data center rack may be investigated. For example, timings of and conditions for failures, desired gas flow and other environmental parameters for improved performance and/or reliability and/or desired changes in configurations of the network components in a data center rack may be determined. As a result, performance and reliability of network components in a data center rack may be determined. In addition, more optimal conditions in a data center may be discovered. Using method 300, therefore, performance, reliability and operation of network components in data racks for data centers may be investigated and improved.

Figure 4:
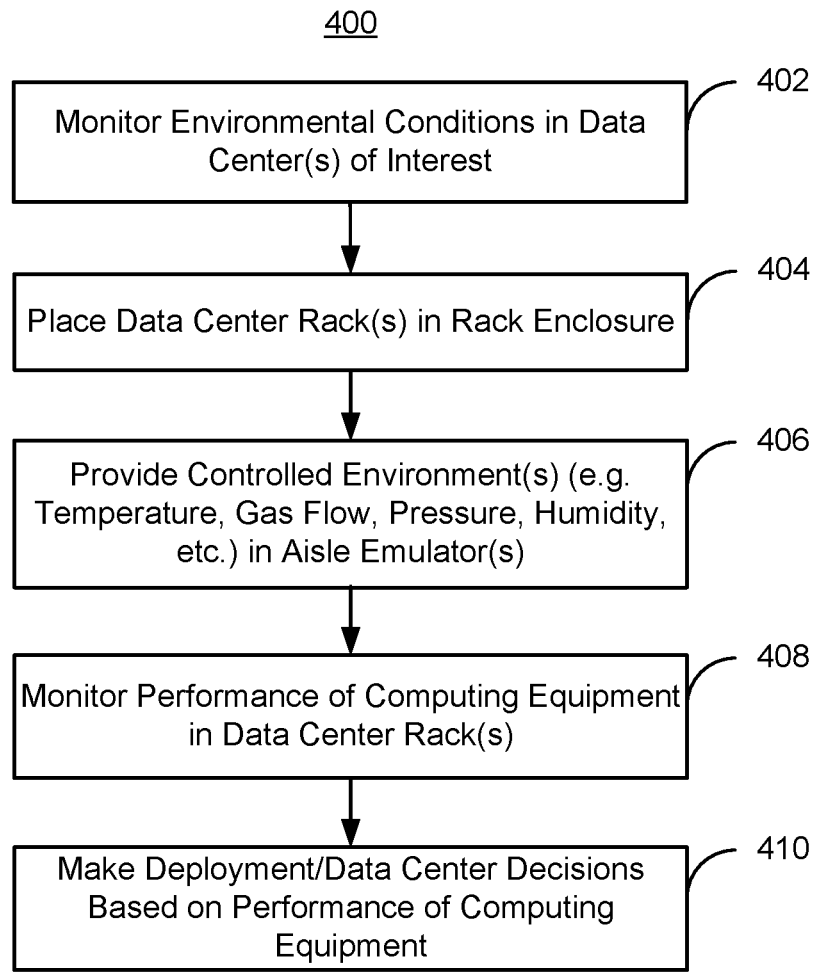
FIG. 4 is a flow chart depicting another embodiment of a method for testing computing equipment in a data center rack.

FIG. 4 is a flow chart depicting an embodiment of another method 400 for testing computing equipment in a data center rack. Method 400 is described in the context of system 100. However, method 400 may be utilized with other systems, including but not limited to system 200. Although shown in a particular order, at least some of the processes may be performed in another order including but not limited to in parallel. For simplicity, only some of the processes may be shown.

Environmental conditions in data center(s) of interest are monitored, at 402. For example a bank of sensors may be placed at or near one or more sides of selected data center racks. In some embodiments, a mesh of environmental sensors may be placed at or near the side(s) of data center rack(s). The temperature, gas flow, humidity and/or other conditions may be monitored for a selected amount of time (e.g. minutes, hours, days, or weeks). 402 may be repeated for multiple locations in a data center and/or multiple data centers. Monitoring location(s) in data centers that are of interest provides information relating to the real world conditions in particular data centers. This information may be used to simulate the data centers for testing network components, to determine best case and worse case operating conditions, to determine baseline conditions to test how changes in data center operating conditions affect network component performance, to determine initial conditions for particular test(s) and/or for other purposes.

One or more data center racks are placed in a data center rack enclosure of a system, at 404. In some embodiments, 404 is analogous to 302 of method 300. Thus, connections to power and/or to sensors for monitoring network components and/or environmental conditions are made.

Controlled test environments are provided at some or all side(s) of the data center rack, at 406. In some embodiments, the controlled test conditions are provided at one or more sides of a data center rack enclosure. For example, temperature, gas (e.g. air) flow, pressure and/or humidity may be controlled to simulate the conditions at selected location of a particular data center detected at 402. In some embodiments, conditions may also be varied in a manner analogous to variations sensed at 402. In some embodiments, the environment produced is based on the conditions sensed at 402 but differs from these conditions. For example, higher or lower temperature(s), higher or lower gas flow(s), different humidity/humidities and/or different pressure(s) may be maintained. In some embodiments, the best case and/or worst case operating conditions sensed at 402 may be simulated at 406. In addition, specific changes in the operating conditions detected at 402 can be investigated by using the environment sensed at 402 as a baseline and changing particular parameter(s). For example, the result of raising or lowering temperature and/or gas flow may be investigated. First and/or second aisle emulators may control the environment at the first and/or second side(s) of the data center rack. Ports and environmental control units may be used to reproduce the conditions at the sides of the data center rack(s). In some embodiments, other parameters may also be controlled. 406 is analogous to 304 of method 300. Thus, at 406 the data center rack and components therein are subjected to the desired environmental conditions.

Performance of one or more of the network components in the data center rack is monitored at least while the network component(s) are operating and subject to the environment provided, at 408. Thus, changes in performance of network components, including the occurrence of failures, and/or other effects of the environment provided at 406 can be investigated at 408. At 410, decisions on deploying network components, the configuration of components within a data center rack, control over environmental conditions such as gas flow and gas temperature at a data center and/or other choices relating to control of data centers and network components therein may be made based on the data collected in 408.

Method 400 allows network components in one or more data center racks, such as network components 162 housed in data center rack 160, to be monitored together while operating and under controlled conditions. As a result, performance and reliability of network components in a data center rack may be determined. Failure conditions for network components may also be examined. In addition, more optimal conditions in a data center may be discovered. Using method 400, therefore, performance, reliability and operation of network components in data racks for data centers may be investigated and improved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system comprising:
    a data center rack enclosure configured to retain a data center rack, the data center rack having a first side and a second side;
    a first aisle emulator coupled with the data center rack enclosure, the first aisle emulator providing a first controlled test environment with a first temperature and a first gas flow to the first side of the data center rack, wherein the first aisle emulator includes a first plurality of walls forming a first sealable chamber therein and a first environmental control unit, at least one of the first plurality of walls including at least a first port therein, the first environmental control unit being coupled with the at least the first port; and
    a second aisle emulator coupled with the data center rack enclosure, the second aisle emulator providing a second controlled test environment for the second side of the data center rack, wherein the second aisle emulator includes a second plurality of walls forming a second sealable chamber therein and a second environmental control unit, at least one of the second plurality of walls including at least a second port therein, the second environmental control unit being coupled with the at least the second port;

wherein the first aisle emulator and the second aisle emulator are sealably coupled with the data center rack enclosure.

2. The system of claim 1, wherein the first aisle emulator further provides at least one of a first pressure or a first humidity to the first side of the data center rack and wherein the second aisle emulator further provides at least one of a second pressure or a second humidity to the second side of the data center rack.

3. The system of claim 1, wherein the first aisle emulator and the second aisle emulator are configured to provide the first gas flow from the first side of the data center rack to the second side of the data center rack, thereby forming a second gas flow from the second side.

4. The system of claim 1, wherein the first aisle emulator is a cold aisle emulator and the second aisle emulator is a hot aisle emulator, the first temperature of the cold aisle emulator being less than a second temperature of the hot aisle emulator.

5. The system of claim 1, wherein the data center rack enclosure further includes at least one power connection for the data center rack.

6. The system of claim 1, further comprising:
a plurality of sensors for measuring at least one of the first temperature, the first gas flow, the second controlled test environment or a network component performance parameter of a network component, the data center rack housing the network component.

7. A system, comprising:
a data center rack enclosure configured to retain a data center rack, the data center rack having a first side, a second side, a third side, and a fourth side opposite to the third side,
a first aisle emulator coupled with the data center rack enclosure, the first aisle emulator providing a first controlled test environment with first temperature and a first gas flow to the first side of the data center rack; and
a second aisle emulator coupled with the data center rack enclosure, the second aisle emulator providing a second controlled test environment for the second side of the data center rack;
the data center rack enclosure having a first lateral wall and a second lateral wall opposite to the first lateral wall, the third side being adjacent to the first lateral wall, at least one of the first lateral wall or the second lateral wall having a port therein, the port being connectable to an environmental control unit;
wherein the first aisle emulator and the second aisle emulator are sealably coupled with the data center rack enclosure.

8. A system comprising:
a data center rack enclosure configured to retain a data center rack, the data center rack having a first side and a second side, the data center rack for housing computing equipment, the data center rack enclosure further including at least one power connection for providing power to computing equipment;
a cold aisle emulator sealably coupled with the data center rack enclosure such that the cold aisle emulator provides a first controlled test environment including first temperature and a first gas flow to the first side of the data center rack, the cold aisle emulator including a first plurality of walls forming a first sealable chamber therein and a first heating ventilation and cooling (HVAC) system, at least one of the first plurality of walls including at least one port therein, the first HVAC system being coupled with the at least one port;
a hot aisle emulator sealably coupled with the data center rack enclosure to provide a second controlled test environment, the second controlled test environment including a second temperature and a second gas flow received from the second side of the data center rack, the second temperature being greater than the first temperature, the cold aisle emulator and the hot aisle emulator being configured such that the first gas flow passes from the first side of the data center rack, proximate to the computing equipment on the data center rack and to the second side of the data center rack to form the second gas flow, wherein the hot aisle emulator includes a second plurality of walls forming a second sealable chamber therein, at least one of the second plurality of walls including at least a second port therein, the at least the second port being configured to be coupled with an environmental control unit; and
a plurality of sensors for measuring at least one performance parameter of the computing equipment.

9. A method, comprising:
providing a first controlled test environment in a first aisle emulator of a testing system, the testing system including the first aisle emulator, a data center rack enclosure sealably coupled with the first aisle emulator, and a second aisle emulator sealably coupled with the data center rack enclosure, the data center rack enclosure for housing a data center rack housing computing equipment, the data center rack having a first side and a second side, the first aisle emulator including a first plurality of walls forming a first sealable chamber therein and a first environmental control unit, at least one of the first plurality of walls including at least a first port therein, the first environmental control unit being coupled with the at least the first port, the first controlled test environment including a first temperature and a first gas flow to the first side of the data center rack, the second aisle emulator coupled maintaining a second controlled test environment for the second side of the data center rack, the second aisle emulator including a second plurality of walls forming a second sealable chamber therein and a second environmental control unit, at least one of the second plurality of walls including at least a second port therein, the second environmental control unit being coupled with the at least the second port; and
monitoring performance of the computing equipment.

10. The method of claim 9, further comprising:
monitoring a location in a data center to provide a location temperature and a location gas flow; and
wherein the providing the first controlled test environment includes providing the location temperature and the location gas flow in the first aisle emulator.

11. The method of claim 9, wherein providing the first controlled test environment further includes:
providing at least one of a first pressure or a first humidity to the first side of the data center rack; the method further comprising providing at least one of a second pressure or a second humidity to the second side of the data center rack using the second aisle emulator.

12. The method of claim 9, wherein the providing the first controlled test environment further includes:

configuring the first environmental control unit to provide the first controlled test environment.

13. The method of claim 12, further comprising:

maintaining the second controlled test environment using the second environmental control unit.

14. The method of claim 9, further comprising:

coupling the computing equipment with at least one power connection of the data center rack enclosure.

15. The method of claim 9, further comprising:

monitoring at least one of the first gas flow, the first temperature or the second controlled test environment with a plurality of sensors incorporated in the testing system.

16. The method of claim 9, wherein the monitoring further includes:

monitoring at least one performance parameter using a plurality of sensors.

* * * * *